United States Patent
Yang et al.

(10) Patent No.: US 8,570,138 B2
(45) Date of Patent: Oct. 29, 2013

(54) RESISTIVE SWITCHES

(75) Inventors: Jianhua Yang, Palo Alto, CA (US);
Dmitri Borisovich Strukov, Mountain View, CA (US); Shih-Yuan Wang, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 13/387,680

(22) PCT Filed: Mar. 3, 2010

(86) PCT No.: PCT/US2010/026092
§ 371 (c)(1),
(2), (4) Date: Jan. 27, 2012

(87) PCT Pub. No.: WO2011/109019
PCT Pub. Date: Sep. 9, 2011

(65) Prior Publication Data
US 2012/0126932 A1    May 24, 2012

(51) Int. Cl.
*H01C 7/10*    (2006.01)

(52) U.S. Cl.
USPC .............................................. 338/20; 338/13

(58) Field of Classification Search
USPC ...................................................... 338/20, 13
See application file for complete search history.

(56) References Cited

U.S. PATENT DOCUMENTS

| | | | |
|---|---|---|---|
| 6,204,139 B1 * | 3/2001 | Liu et al. | 438/385 |
| 6,815,744 B1 * | 11/2004 | Beck et al. | 257/295 |
| 7,796,416 B2 * | 9/2010 | Ishihara et al. | 365/148 |

FOREIGN PATENT DOCUMENTS

| | | |
|---|---|---|
| JP | 2007180202 | 7/2007 |
| JP | 2008084512 | 4/2008 |
| JP | 2009049183 | 3/2009 |
| KR | 20070111840 | 11/2007 |

* cited by examiner

*Primary Examiner* — Kyung Lee

(57) ABSTRACT

Resistive switches and related methods are provided. Such a resistive switch includes an active material in contact with opposite end electrodes. The active material defines electron traps that capture or release charges in accordance with applied switching voltages. Resistive switches are characterized by ON state and OFF state resistance curves. Resistance ratios of ten times or more are exhibited. The state of a resistive switch is determined using sensing voltages lesser then the switching threshold.

14 Claims, 4 Drawing Sheets

RESISTIVE SWITCHES

BACKGROUND

Resistive switches exhibit a plurality of distinct electrical resistances respectively corresponding to various operating states. Sometimes, two distinct "ON" and "OFF" states are defined at (or near) opposite ends of the resistive range for a given resistive switch. No moving parts are involved due to their solid state construction, and switching between states is achieved by way of control signaling.

However, most of the known resistive switches require undesirably high switching and reading (i.e., state sensing) currents. Additionally, such relatively high currents cause excessive heating, resulting in undesirably short operating life spans. The present teachings are directed to the foregoing and other related concerns.

BRIEF DESCRIPTION OF THE DRAWINGS

The present embodiments will now be described, by way of example, with reference to the accompanying drawings, in which.

DETAILED DESCRIPTION

Introduction

Means and methods related to resistive switches are provided by the present teachings. A resistive switch includes an active material in contact with opposite end electrodes. The active material defines electron traps that capture or release charges in accordance with applied switching voltages. Resistive switches are characterized by respectively different ON-state and OFF-state resistance curves. Resistance ratios of ten times or more are exhibited. The state of a resistive switch is determined using sensing voltages lesser then the switching threshold.

In one embodiment, an apparatus includes a resistive switch. The resistive switch includes a first electrode and an active material layer in contact with the first electrode. The resistive switch further includes a second electrode disposed opposite the first electrode. The active material layer is also in contact with the second electrode. The resistive switch is characterized by a first electrical resistance curve in response to an applied forward switching voltage. The resistive switch further is characterized by a second electrical resistance curve in response to an applied reverse switching voltage. The second electrical resistance curve is different than the first electrical resistance curve.

In another embodiment, a method includes operating a resistive switch characterized by a first electrical resistance curve. The resistive switch is characterized by a first end electrode and a second end electrode, and an active material layer disposed between and in contact with the first and second end electrodes. The method also includes switching the resistive switch so as to change the character of the resistive switch from the first electrical resistance curve to a second electrical resistance curve distinct from the first. The method further includes operating the resistive switch characterized by the second electrical resistance curve.

First Illustrative Embodiment

Figure 1:
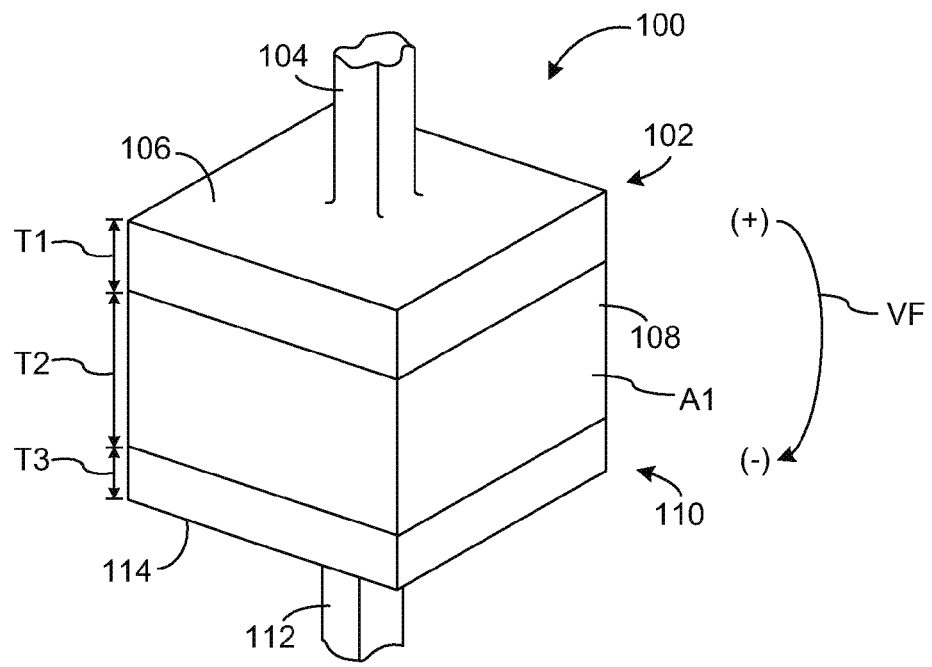
FIG. 1 depicts an isometric view depicting a resistive switch according to one embodiment.

Reference is now directed to FIG. 1, which depicts an isometric view of a resistive switch (switch) 100 according to the present teachings. The switch 100 is illustrative and non-limiting with respect to the present teachings. Thus, other switches can be configured and/or operated in accordance with the present teachings.

The resistive switch 100 includes a first end electrode 102. The end electrode 102 includes a lead portion 104 extending away from an end area portion 106. In one embodiment, the end electrode 102 is formed from (or includes) platinum (Pt). Other suitable metals or materials can also be used. In one embodiment, the end electrode 102 is defined by a thickness dimension "T1" of about nine nanometers (one nanometer = $1 \times 10^{-9}$ meters). Other suitable thicknesses can also be used.

The switch 100 also includes an active material layer (AML) 108. The AML 108 is in contact with the first end electrode 102 and is defined by a thickness dimension "T2", and across-sectional area "A1" normal to the thickness dimension T2. In one embodiment, the AML 108 is formed from (or includes) titanium dioxide ($TiO_2$) having a thickness T2 in the range of four-to-100 nanometers and a cross-sectional area A1 of 1 micrometer square to 100 nanometers square. Other suitable materials, thicknesses or cross-sectional areas can also be used. In one embodiment, the AML 108 is formed by sputtering at ambient temperature.

The resistive switch 100 further includes a second end electrode 110. The end electrode 110 includes a lead portion 112 extending away from an end area portion 114. In one embodiment, the end electrode 110 is formed from (or includes) platinum (Pt). Other suitable metals or materials can also be used. In one embodiment, the end electrode 110 is defined by a thickness dimension "T3" of about nine nanometers. Other suitable thicknesses can also be used.

The AML 108 is contact with the second end electrode 110. Thus, the active material layer 108 is disposed between, and in contact with, the end electrodes 102 and 110, respectively. In this way, the resistive switch 100 is also referred to as a two-terminal device or two-terminal switch. The end electrodes 102 and 110, respectively, are configured to electrically couple the switch 100 to another entity or entities (e.g., electronic circuitry, various components, etc.).

The active material layer 108 is configured to define a plurality of "electron traps" that release electrons under the influence of a first ("forward") applied electrical potential, and capture electrons under the influence of a second ("reverse") applied electrical potential. These forward and reverse potentials are also referred to as forward (I.e., "ON") and reverse (i.e., "OFF") switching voltages, respectively. In one embodiment, the electron traps are defined by oxygen vacancies in the titanium dioxide ($TiO_{2-x}$).

It is noted that the forward and reverse switching voltages are of opposite polarity to one another as applied to the end electrodes 102 and 110 of the switch 100. Thus, for purposes of the present teachings, a forward potential is applied as positive to electrode 102 and negative to electrode 110, while a reverse potential is applied as negative to electrode 102 and positive to electrode 110. Applied forward potential is depicted by the polarity arrow "VF" in FIG. 1.

It is further noted that the resistive switch 100 is characterized by a nominal electrical resistance in the ON state, and a different nominal electrical resistance in the OFF state. Such ON and OFF electrical resistances are retained for at least a day when electric potential is completely removed from the resistive switch 100. In particular, these ON and OFF resistances are defined by respective resistance curves that are non-linear in nature, and which are described in illustrative and non-limiting terms hereinafter.

The Table 1 below summarizes parameters and characteristics of an illustrative and non-limiting embodiment of the resistive switch 100 in accordance with the present teachings:

TABLE 1

Illustrative Resistive Switch 100

| Element/Characteristic | Value/Notes |
| --- | --- |
| End Electrode 102 | Pt; T1 = 9 nm |
| Active Material Layer 108 | $TiO_2$; T2 = 4-100 nm; A1 = $10^2$~$10^6$ $nm^2$ |
| End Electrode 110 | Pt; T1 = 9 nm |
| ON Switching Voltage | 2.0 Volts DC |
| OFF Switching Voltage | −2.0 Volts DC |
| ON Resistance (nominal) | $1 \times 10^7$ Ohms |
| OFF Resistance (nominal) | $5 \times 10^9$ Ohms |

First Illustrative Method

Figure 2:
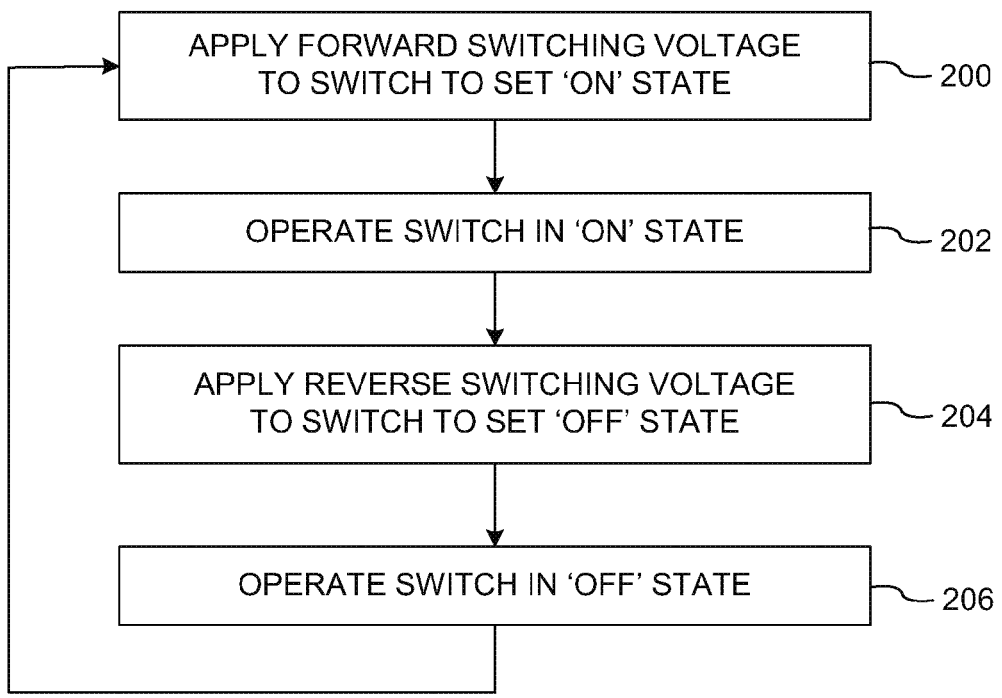
FIG. 2 is a flow diagram depicting a method according to one embodiment.

Attention is now directed to FIG. 2, which depicts a flow diagram of a method according to one embodiment of the present teachings. The method of FIG. 2 includes particular operations and order of execution. However, other methods including other operations, omitting one or more of the depicted operations, and/or proceeding in other orders of execution can also be used according to the present teachings. Thus, the method of FIG. 2 is illustrative and non-limiting in nature. Reference is also made to FIG. 1 in the interest of understanding the method of FIG. 2.

At 200, a forward switching voltage is applied to a resistive switch so as to set an "ON" state. For purposes of non-limiting example, it is assumed that about two volts direct-current (DC) potential is applied to resistive switch 100. Such potential is applied as positive to electrode 102 and negative to electrode 110, thus defining a forward switching potential. In so doing, electrons are driven from traps within the active material layer 108 and the electrical resistance of the switch 100 is set to about ten-million Ohms (nominal) value.

At 202, the resistive switch is operated in the ON state. For purposes of the ongoing example, it is assumed that the instantaneous resistance value of the switch 100 is sensed from time to time by way of an applied sensing voltage. The sensing voltage is of lesser magnitude than either a forward or reverse switching voltage, and thus does not cause switching (i.e., change in state) of the switch 100. The sensing voltage is thus considered a "reading" voltage. The sensing voltage can be applied in either the forward or reverse orientation, as desired.

At 204, a reverse witching voltage is applied to a resistive switch so as to set an "OFF" state. For purposes of the ongoing example, it is assumed that about minus two volts direct-current (DC) potential is applied to resistive switch 100. Such potential is applied as negative to electrode 102 and positive to electrode 110, thus defining a reverse switching potential. In so doing, electrons are captured (i.e., accumulated) within the traps of the active material layer 108 and the electrical resistance of the switch 100 is set to about five-billion Ohms (nominal) value.

At 206, the resistive switch is operated in the OFF state. For purposes of the ongoing example, it is assumed that the instantaneous resistance value of the switch 100 is sensed from time to time by way of an applied sensing voltage. The sensing voltage is of insufficient magnitude to cause switching of the switch 100, and is considered a "reading" voltage. The sensing voltage can be applied in either the forward or reverse orientation. The method can then (eventually) return to step 200 above. In this way, the method depicts "toggling" a resistive switch between ON and OFF states, as desired.

First Illustrative Device

Figure 3:
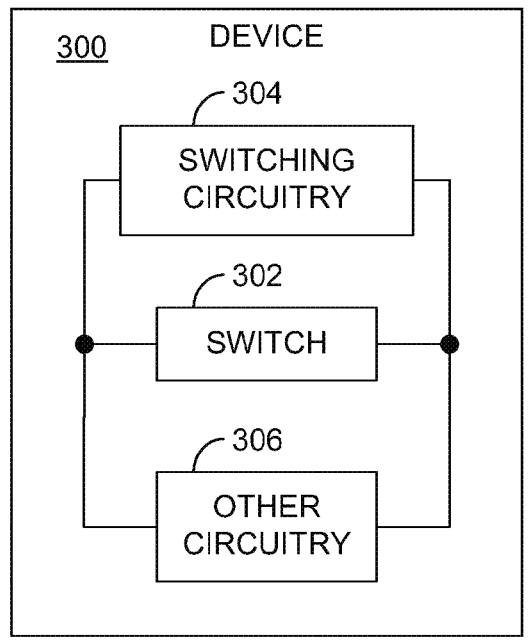
FIG. 3 is a block diagram depicting a device according to one embodiment.

Reference is now made to FIG. 3, which depicts a block diagram of a device 300 according to another embodiment of the present teachings. The device 300 is illustrative and non-limiting in nature. Thus, other devices, circuits and systems are contemplated that include one or more aspects of the present teachings.

The device 300 includes a resistive switch (switch) 302. The switch 302 can be defined by any embodiment consistent with the present teachings. In one embodiment, the switch 302 is materially and operationally equivalent to the switch 100 as described above. Other embodiments can also be used.

The device 300 also includes switching circuitry 304. The switching (or control) circuitry 304 is electrically coupled to the switch 302 and is configured to apply forward and reverse switching voltages thereto. The switching circuitry 304 is thus configured to cause controlled changes in the electrical resistance of the switch 302. The switching circuitry 304 is further configured to sense the instantaneous electrical resistance (i.e., ON or OFF state) of the switch 304 by way of appropriate sensing voltage(s). The switching circuitry 304 can be defined by or include any suitable components or configuration such as, but not limited to, a microprocessor, a microcontroller, digital circuitry, analog circuitry, a state machine, etc.

The device 300 further includes other circuitry 306 that is electrically coupled to (or includes) the switch 302. The other circuitry 306 can be defined by any suitable circuitry configured to perform one or more normal operations using the switch 302. Non-limiting examples of such operations include cellular communication, environmental sensing, instrumentation and control, radio communication, data storage and retrieval, etc. Thus, the device 300 can be generally defined by any one or more suitable areas of application (e.g., a cellular telephone, a data storage array, etc.).

Second Illustrative Device

Figure 4:
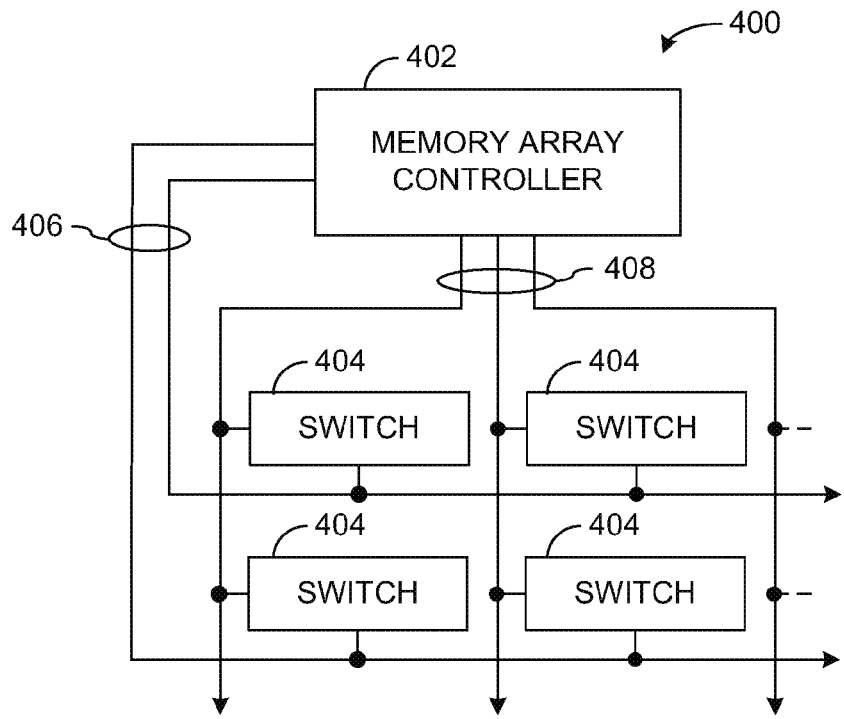
FIG. 4 is a block diagram depicting a device according to another embodiment.

Reference is now made to FIG. 4, which depicts a block diagram of a device 400 according to another embodiment of the present teachings. The device 400 is illustrative and non-limiting in nature. Thus, other devices, circuits and systems are contemplated that include one or more aspects of the present teachings.

The device 400 includes a memory array controller (controller) 402. The controller 402 is configured to address individual switches 404 of the device 400. Such addressing is performed by way of row control lines 406 and column control lines 408. The controller 402 is also configured to apply forward and reverse switching voltages, as well as reading voltages, to the switches 404 by way of the controls lines 406 and 408.

The device 400 further includes a plurality of switches 404. Each switch 404 is defined, configured and operative in accordance with the present teachings. In one embodiment, one or more of the switches 404 is are materially and operationally equivalent to the resistive switch 100 described above. Other embodiments can also be used.

The switches 404 are arranged as an X-by-Y array, with each switch 404 being individually addressable by the controller 402. Each switch 404 can be operated as a storage cell representing a digital bit, etc. FIG. 4 depicts a total of four switches 404 arranged as an array. However, it is to be understood that other arrays including any suitable number of switches can also be defined and operated in accordance with the present teachings.

Illustrative Operating Theory

Figure 5:
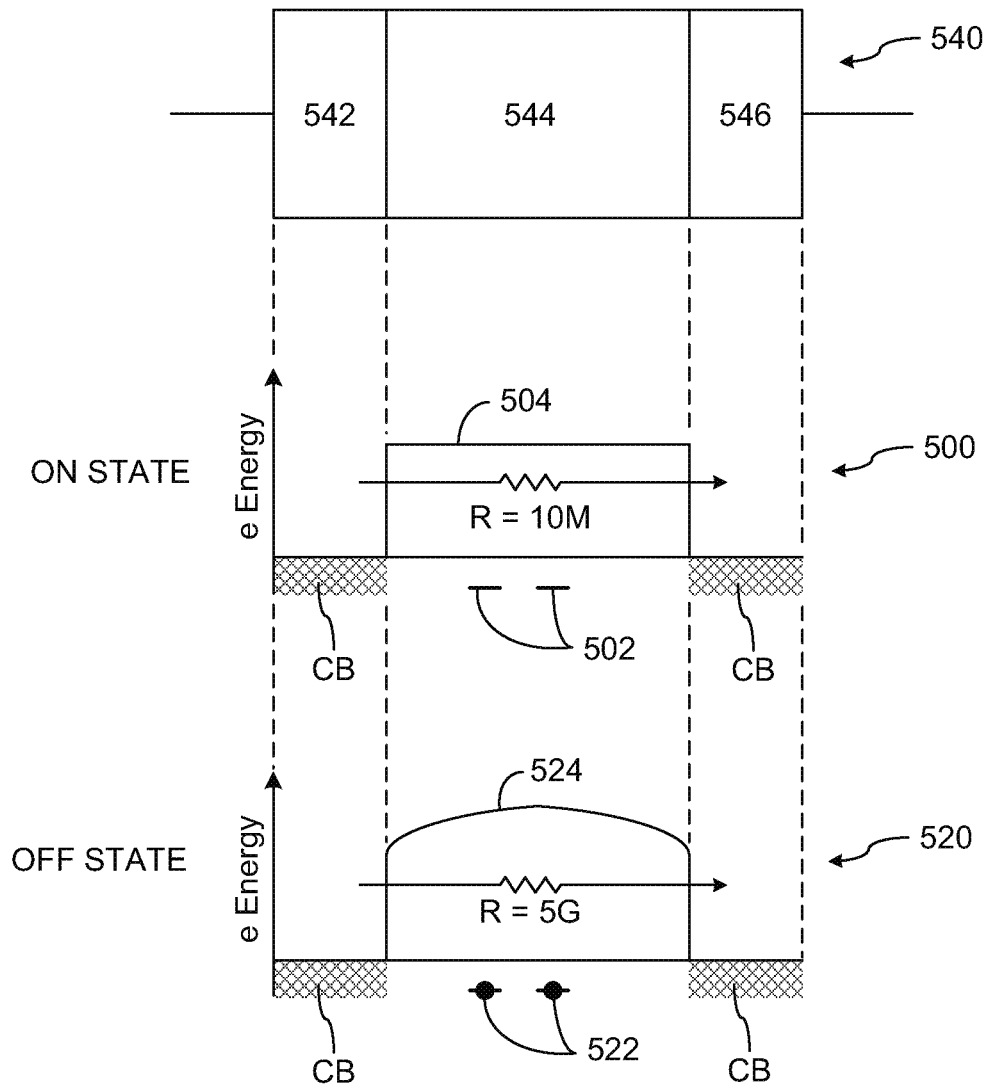
FIG. 5 depicts illustrative energy level diagrams according to the present teachings.

Attention is now directed to FIG. 5, which depicts energy level diagrams 500 and 520, respectively corresponding to an illustrative and non-limiting resistive switch 540 according to the present teachings. The energy level diagrams 500 and 520 are general in nature, and are depicted for purposes of better understanding the present teachings.

As a preliminary matter, it is noted that the illustrative resistive switch 540 includes a first platinum electrode 542, a titanium dioxide (active material) layer 544, and a second platinum electrode 546. Relative dimensions of the electrodes 542 and 546 and the AML 544 are exaggerated within FIG. 5 in the interest of clarity.

The energy level diagram 500 corresponds to an ON state for the resistive switch 540, having a nominal electrical resistance of ten million Ohms from electrode 542 to electrode 546. It is noted that the electrodes 542 and 546, being formed of platinum, are respectively characterized by electron energy levels within (or substantially so) the conduction band "CB". It is also noted that active material layer 544 is characterized by illustrative electron traps 502. The electron traps 502 are "empty" or devoid of trapped charges, respectively. In this ON state, the electron energy level of the AML 544 corresponds to an illustrative barrier height 504.

In turn, the energy level diagram 520 corresponds to an OFF state for the resistive switch 540, having a nominal electrical resistance of five billion Ohms from electrode 542 to electrode 546. It is noted that active material layer 544 is characterized by negative charges 522 held within respective electron traps 502. In this OFF state, the electron energy level of the AML 544 corresponds to an illustrative barrier height 524 that is greater than the barrier height 504. The distinct ON and OFF state (nominal) resistances are attributable to these respectively different barrier heights 504 and 524

Illustrative Signal Diagrams

Figure 6:
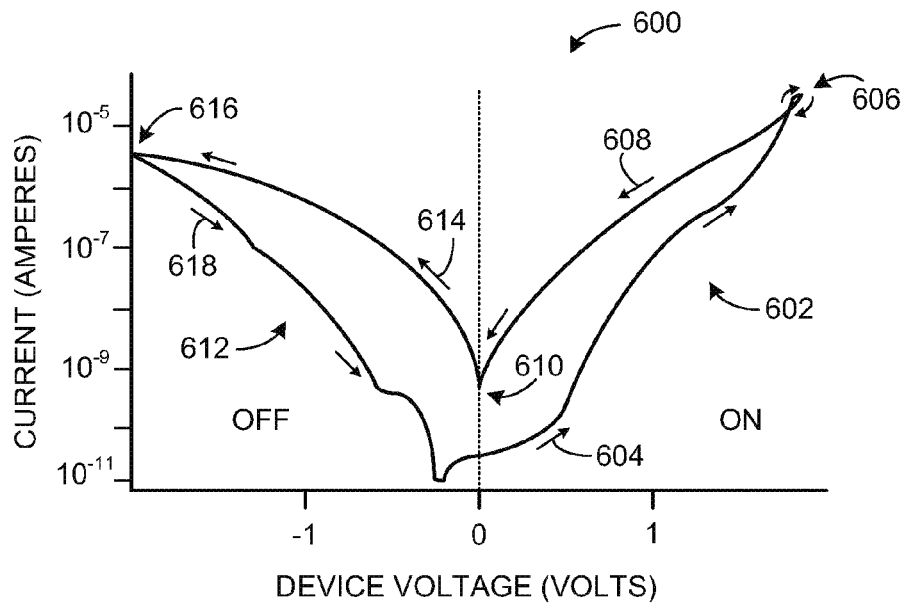
FIG. 6 is a signal diagram depicting illustrative signal curves according to the present teachings.

FIG. 6 is a signal diagram 600 according to one embodiment of the present teachings. The diagram 600 is general and illustrative in nature. It is to be understood that the diagram 600 is provided in the interest of understanding the present teachings. As such, varying embodiments of resistive switch according to the present teachings correspond to respectively varying signal diagrams. For purposes of non-limiting illustration, it is assumed that the signal diagram 600 corresponds to electrical behavior of an embodiment of resistive switch 100 as described above.

The signal diagram 600 includes a first curve portion 602 corresponding to ON switching behavior for the illustrative resistive switch. Specifically, the portion 602 plots applied forward voltage versus switch current. It is assumed that applied forward voltage begins at zero and increases in magnitude, with corresponding switch current beginning on the lower branch of the curve 602 and increasing as shown by arrow 604. The switch current increases with increases in applied forward voltage, along the lower branch of the curve 602, until a "fold-over" point 606 is reached. The resistive switch is now in an ON state.

During typical normal operation, forward voltage is not increased beyond point 606, as such is unnecessary to either switching or reading the resistive switch. Furthermore, increase in applied forward voltage beyond point 606 result in excess heating and premature damage to the resistive switch.

From point 606, forward voltage is decreased back toward zero. In response, the current follows along the upper branch of signal curve 602 as shown by arrow 608. As the forward voltage approaches zero, the current through the resistive switch decreases toward a point 610. This current value at point 610 is a greater value than the original staring point. The upper branch of the curve portion 602 represents the non-volatile resistance curve of the resistive switch while it is in the ON state.

The signal diagram 600 also includes a second curve portion 612 corresponding to OFF switching behavior for a resistive switch of the ongoing illustration. Specifically, the portion 612 plots applied reverse voltage versus switch current. It is assumed that applied reverse voltage begins at zero and increases in magnitude (i.e., increasing absolute value) with corresponding switch current beginning at about the point 610 and increasing as shown by arrow 614. The switch current increases with applied reverse voltage, along the upper branch of the curve 612. Eventually, a point 616 is reached, and the resistive switch is now in an OFF state.

During typical normal operation, reverse voltage is not increased beyond point 616, as such is unnecessary to either switching or reading the resistive switch. The current response curve generally flattens beyond the point 616—that is, the resistive switch exhibits diode-like behavior.

From point 616, reverse voltage is decreased back toward zero. In response, the current follows along the lower branch of curve portion 612 as shown by arrow 618. As the reverse voltage approaches zero, the current through the resistive switch decreases to a lesser value than the original staring point. The lower branch of the curve portion 612 represents the non-volatile resistance curve of the resistive switch while It is in the OFF state.

Figure 7:
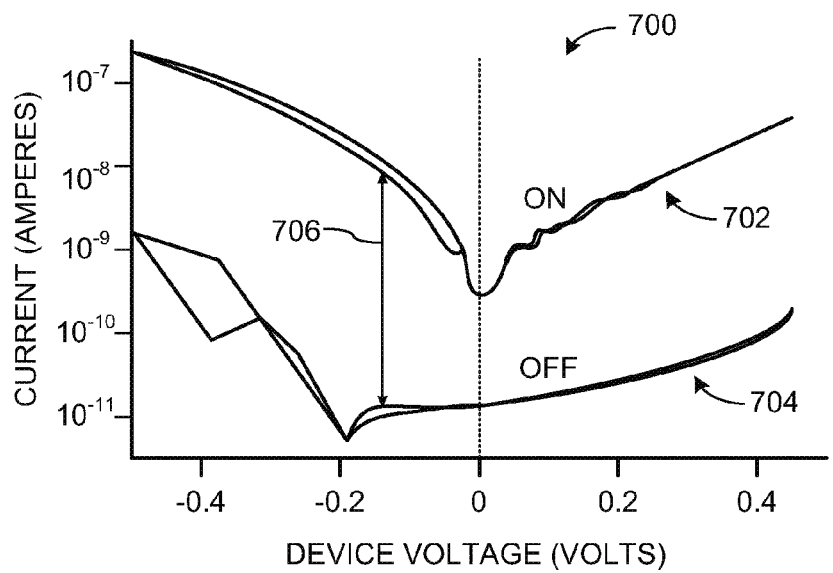
FIG. 7 is a signal diagram depicting illustrative signal curves according to the present teachings.

Attention is now directed to FIG. 7, which is a signal diagram 700 according to one embodiment of the present teachings. The diagram 700 is general and illustrative in nature, and corresponds to the signal diagram 600. It is to be understood that the diagram 700 is provided in the interest of understanding the present teachings. The signal diagram 700 depicts electrical behavior for an illustrative resistive switch (e.g., switch 100) when subject to sensing (state reading) voltages in the ON and OFF states; respectively.

The signal diagram 700 includes a first curve portion 702 corresponding to ON reading (i.e., sensing) behavior for an illustrative resistive switch. As applied sensing voltage increases or decreases away from zero, corresponding switch current begins to flow as depicted the curve portion 702. Thus, ON state resistance can be determined with either a forward or reverse sensing voltage.

The signal diagram 700 includes a second curve portion 704 corresponding to OFF reading behavior for an illustrative resistive switch. As applied sensing voltage increases or decreases away from zero, corresponding switch current begins to flow as depicted the curve portion 704. The OFF state resistance of the switch can be determined with either a forward or reverse sensing voltage. A differential 706 between the curves 702 and 704 corresponds to the difference between the OFF state and ON state resistances for some particular sensing voltage.

Straightforward sampling and testing can determine the respective OFF and ON resistance curves for a particular embodiment of resistive switch. Those results can then be used to determine a sensing voltage corresponding to the greatest OFF-to-ON resistance ratio. This "optimized" sensing voltage value can then be used with corresponding embodiments of resistive switch. In one embodiment, a forward sensing voltage of about zero-point-five volts is used. Other values can also be used.

In general, and without limitation, the present teachings contemplate various resistive switches including opposite end electrodes and an active material layer in contact there between. Such resistive switches are also referred to as two-terminal devices. The active material layer defines a number of electron traps. A forward switching voltage can be applied to the end electrodes causing a release of charges from the electron traps. Conversely, a reverse switching voltage respectively can be applied to the end electrodes causing an accumulation of charges within the electron traps. In this way, the resistive switch can be driven in to ON and OFF states, respectively.

Respective, resistance curves correspond to the ON and OFF states of the resistive switch. Additionally, the present state of the switch (ON or OFF) can be determined by way of a sensing (or reading) voltage applied in either a forward or reverse polarity. The sensing voltage is notably lower in magnitude then either the ON or OFF switching voltage, and thus does not cause switching of the resistive switch. Resistive switches of the present teachings can be used within data storage arrays, less communications equipment, instrumentation and control apparatus, computers, and numerous other devices and systems.

In general, the foregoing description is intended to be illustrative and not restrictive. Many embodiments and applications other than the examples provided would be apparent to those of skill in the art upon reading the above description. The scope of the invention should be determined, not with reference to the above description, but should instead be determined with reference to the appended claims, along with the full scope of equivalents to which such claims are entitled. It is anticipated and intended that future developments will occur in the arts discussed herein, and that the disclosed systems and methods will be incorporated into such future embodiments. In sum, it should be understood that the invention is capable of modification and variation and is limited only by the following claims.

What is claimed is:

1. An apparatus including a resistive switch, the resistive switch comprising:
   a first electrode;
   an active material layer in contact with the first electrode; and
   a second electrode disposed opposite the first electrode, the active material layer in contact with the second electrode, the resistive switch characterized by a first electrical resistance curve in response to an applied forward switching voltage, the resistive switch further characterized by a second electrical resistance curve in response to an applied reverse switching voltage, the second electrical resistance curve being different than the first electrical resistance curve,
   wherein the active material layer is to define a plurality of electron traps.

2. The apparatus according to claim 1, at least the first electrical resistance curve or the second electrical resistance curve being persistent for at least a day.

3. The apparatus according to claim 1, the forward switching voltage being of opposite polarity to the reverse switching voltage.

4. The apparatus according to claim 1, the second electrical resistance curve being at least ten times greater than the first electrical resistance curve.

5. The apparatus according to claim 1, at least the first electrode or the second electrode including platinum.

6. The apparatus according to claim 1, the active material layer including titanium dioxide.

7. The apparatus according to claim 1, the first electrical resistance being further defined by a first electrical resistance curve, the second electrical resistance being further defined by a second electrical resistance curve.

8. The apparatus according to claim 1, the active material layer configured such that the plurality of electron traps are defined by oxygen vacancies.

9. The apparatus according to claim 1, the active material layer being characterized by a thickness extending from the first electrode to the second electrode, the thickness being in the range of about four nanometers to about one-hundred nanometers.

10. The apparatus according to claim 1 further comprising control circuitry configured to:
    apply the forward switching voltage to the resistive switch; and
    apply the reverse switching voltage to the resistive switch.

11. The apparatus according to claim 10, the control circuitry further configured to determine the instantaneous electrical resistance of the resistive switch by way of a sensing voltage.

12. The apparatus according to claim 11, the control circuitry further configured such that the magnitude of the sensing voltage is insufficient to cause switching of the resistive switch.

13. A method, comprising:
    operating a resistive switch characterized by first electrical resistance curve, the resistive switch characterized by a first end electrode and a second end electrode and an active material layer disposed between and in contact with the first and second end electrodes, the active material layer being to define a plurality of electron traps;
    switching the resistive switch so as to change the character of the resistive switch from the first electrical resistance curve to a second electrical resistance curve distinct from the first; and
    operating the resistive switch characterized by the second electrical resistance curve.

14. The method according to claim 13, the switching including either increasing or decreasing a number of electrons trapped within the active material layer by way of an applied switching voltage.

* * * * *